United States Patent [19]
Liu et al.

[11] Patent Number: 5,824,448
[45] Date of Patent: Oct. 20, 1998

[54] NEGATIVE WORKING DIAZO COLOR PROOFING SHEET WITH ADHESIVE LAYER HAVING REDUCED TACKINESS

[75] Inventors: Shuchen Liu, Annandale, N.J.; Robert J. von Trebra, Wheeling, Ill.

[73] Assignee: Bayer Corporation, Pittsburgh, Pa.

[21] Appl. No.: 566,764

[22] Filed: Dec. 4, 1995

[51] Int. Cl.[6] ............................. G03F 7/30; G03F 7/021; G03C 11/12
[52] U.S. Cl. .................... 430/143; 430/162; 430/257; 430/260; 430/293; 430/263
[58] Field of Search ................... 430/260, 143, 430/257, 162, 263, 293

[56] References Cited

U.S. PATENT DOCUMENTS

| | | | |
|---|---|---|---|
| 4,656,114 | 4/1987 | Cederberg et al. | 430/162 |
| 4,751,166 | 6/1988 | Platzer et al. | 430/160 |
| 4,756,988 | 7/1988 | Kausch et al. | 430/257 |
| 4,762,766 | 8/1988 | Melbye et al. | 430/260 |
| 4,885,225 | 12/1989 | Heller et al. | 430/162 |
| 4,929,532 | 5/1990 | Dunder | 430/143 |
| 5,053,310 | 10/1991 | Platzer | 430/143 |
| 5,176,973 | 1/1993 | Gifford et al. | 430/143 |
| 5,183,723 | 2/1993 | Platzer et al. | 430/160 |
| 5,248,583 | 9/1993 | Lundquist et al. | 430/143 |
| 5,529,878 | 6/1996 | Menard et al. | 430/257 |
| 5,547,811 | 8/1996 | Maerz et al. | 430/260 |

FOREIGN PATENT DOCUMENTS

| | | |
|---|---|---|
| 0 365 356 | 4/1990 | European Pat. Off. . |
| 0 655 651 A1 | 5/1995 | European Pat. Off. . |

*Primary Examiner*—John S. Chu
*Attorney, Agent, or Firm*—Roberts & Mercanti, L.L.P.

[57] ABSTRACT

This invention relates to color proofing, or more particularly to an improved photographic element and transfer method of color proofing wherein a colored image is prepared by successively producing images of different colors from distinct color separation films onto a single receptor sheet. The photographic element has a support having a release surface, a colored photosensitive layer on the release surface and an adhesive layer on the colored layer. The adhesive layer comprises a thermally activated adhesive which is preferably a plasticizer in admixture with at least one copolymer selected from the group consisting of copolymers of methyl methacrylate and ethyl acrylate and copolymers of acrylic acid and acrylic esters having an acid number of from about 80 to about 100.

24 Claims, No Drawings

NEGATIVE WORKING DIAZO COLOR PROOFING SHEET WITH ADHESIVE LAYER HAVING REDUCED TACKINESS

BACKGROUND OF THE INVENTION

1. Field of the Invention

The present invention relates to color proofing, or more particularly to an improved transfer type color proofing method wherein a colored image is prepared by successively producing images of different colors from distinct color separation films onto a single receptor sheet.

2. Description of the Prior Art

In the art of lithographic printing, a printer typically produces a series of metal lithographic printing plates which are used to reproduce an original image many thousands of times. However, metal printing plates are expensive and errors in the image can cause considerable unnecessary expense. It has therefore become customary and desirable to produce an inexpensive color proof to assist the printer in judging the quality of the image prior to producing the expensive lithographic printing plates. Color proofing films are used to simulate the image and color quality that will be obtained during the actual printing process. The proof must provide an accurate representation of the desired image, and should neither gain nor lose color. Visual examination of a color proof should reveal any flaws on the photomask, the color gradation expected from press printing, and the need for subduing any of the colors or altering the photomask before making the actual printing plates.

Many methods of color proofing are known in the art. Press proofs are made by printing samples directly from a printing press. This costly and time consuming method undesirably requires that the printer take all the steps necessary for actual multicolor printing. Alternate color proofing methods have therefore been developed to simulate the quality of press proofs. These include the overlay, surprint and transfer types of proofing. In the overlay method, an independent transparent plastic support carries each image color. The supports are then superimposed upon each other and held against a white sheet to produce a composite color proof. This method has the disadvantage that the plastic supports tend to darken the color proofing sheet and the image appears very different from reproductions actually obtained from printing.

In the surprint type of color proofing, a color proofing sheet is successively provided with images of different colors from different color separation films onto a single receptor sheet. This is done by using a single opaque support and successively applying toners, photosensitive solutions or coatings of photosensitive materials of corresponding colors onto the opaque support. An example of this approach is described in U.S. Pat. No. 3,671,236. The surlay method produces an image which more closely resembles that made by actual printing, but the proofing process is messy. The transfer method forms an image on a single receiver sheet by transferring a series of different colored, solid photosensitive layers in a sandwiched array onto the receiver by means of intermediate adhesive layers. Typical transfer proofing methods are described in U.S. Pat. Nos. 4,751,166; 5,053,310; and 4,929,532 which are incorporated herein by reference. A disadvantage of these transfer systems is that the adhesive layer must be sufficiently adherent to secure the image areas of the photosensitive layers during development, yet be able to release the nonimage areas upon development. In addition, since the portion of the adhesive layer underlying the nonimage areas of the photosensitive layer are open to working environments, they tend to attract and stick to dust and other contaminants thereby impairing ultimate image quality. One solution has been to attach a protective layer onto the top of the final image. Such include a transparent, pressure sensitive cellophane tape applied over the image as described in U.S. Pat. No. 4,376,159. The latter produces an unnatural, glossy texture to the image which is not truly representative of the final image to be printed. Another solution has been proposed by U.S. Pat. No. 4,719,169 wherein a thermoplastic adhesive layer and an antiblocking layer are laminated onto the finished image. This is disadvantageous since such top layers increase dot gain. The application of these protective layers also undesirably requires an additional processing step. It would be desirable to identify adhesive layer compositions which sufficiently secure the image areas of the photosensitive layers, release the nonimage areas upon development and are sufficiently nontacky to resist attracting contaminants and thereby eliminate the need for a protective covering. This has been achieved by the method of this invention.

SUMMARY OF THE INVENTION

The invention provides a photographic element which comprises:

i) a substrate having a release surface; and ii) a single photosensitive layer directly on said release surface, which photosensitive layer comprises in admixture, a light sensitive, negative working, polymeric diazonium compound in an amount sufficient to photosensitize the layer; a resinous binder composition in an amount sufficient to bind the layer components, which resinous binder composition contains a major amount of at least one resin selected from the group consisting of a polyvinyl butyral polymer and a styrene-maleic anhydride copolymer half ester; and at least one colorant in an amount sufficient to color the layer; and iii) an adhesive layer directly adhered on said photosensitive layer, which adhesive layer comprises in admixture at least one copolymer selected from the group consisting of copolymers of methyl methacrylate and ethyl acrylate and copolymers of acrylic acid and acrylic esters having an acid number of from about 80 to about 100, said copolymer having a Tg in the range of from about 45° C. to about 65° C.; and a sufficient amount of at least one compatible plasticizer, such that the adhesive layer has a softening point in the range of from about 40° C. to about 120° C.

The present invention also provides an improved method for forming a colored image which comprises (A) providing the above photographic element and (B) either i) laminating said element with heat and pressure via said adhesive layer to a developer resistant receiver sheet; and removing said substrate by the application of peeling forces; and imagewise exposing said photosensitive layer to actinic radiation; or ii) imagewise exposing said photosensitive layer to actinic radiation; and laminating said element with heat and pressure via said adhesive layer to a developer resistant receiver sheet; and removing said substrate by the application of peeling forces; or iii) laminating said element with heat and pressure via said adhesive layer to a developer resistant receiver sheet; and imagewise exposing said photosensitive layer to actinic radiation; and removing said substrate by the application of peeling force; and (C) removing the non-exposed areas of said photosensitive layer with a liquid developer, which removing is conducted at a temperature at which said adhesive layer is substantially non-tacky. Optionally, steps A through C are repeated at least once whereby another photosensitive element having at least one different colorant is laminated onto said receiver sheet over the non-removed portions of the previously laminated photosensitive layer or layers.

DETAILED DESCRIPTION OF THE PREFERRED EMBODIMENT

The photographic element of the invention broadly comprises a support having a release surface, a colored photosensitive layer on the release surface and an adhesive layer on the colored layer. Optional additional layers containing anti-halation materials, adhesion promoters or release agents may also be used.

In the preferred embodiment, the support is composed of a dimensionally and chemically stable base material which does not significantly change its size, shape or chemical properties as the result of the heating coating or other treatments which it must undergo. One preferred material is polyethylene terephthalate. In the usual case it has a thickness of from about 1 to about 10 mils, a more preferred thickness is from about 2 to about 5 mils and most preferably from about 2 to about 3 mils. Suitable films include Hostaphan 3000, available from Hoechst Celanese Corporation, Mylar D, available from DuPont and Melinex grades 0; 052; 442; 516 and S, available from ICI. The surface of the substrate may be smooth or may be provided with a matte texture by various methods known in the art. Matte films include Melinex 377 and 470 from ICI. These materials have the property of giving the final image a desired matte finish. One can control the gloss of the final image by properly selecting the matte finish of the temporary support. This effect works because the top layer of the final image is originally in contact with this matte surface. An additional advantage of coating on a matte surface is that subsequent transferred layers generally adhere better to a rough surface than to a smooth surface. A similar matte finish of the final image can be obtained by embossing the shiny, top surface of the image with a matte material, such as described above. This is done by laminating together the final image and matte material under pressure and temperature. The matte materials is then generally removed after lamination. The advantage of this method is that the finish of the final proof can be varied. Furthermore, the matting material can be used repeatedly. Another method for producing a matte finish uses a heat transferable layer, such as Butvar 90, available from Monsanto, coated onto a film with a rough surface, such as Melinex 329, available from ICI. The layer is laminated to the final image under pressure and temperature. Then the film with the rough surface is peeled off. The rough surface imparts a matte finish to the final image. The advantage is that all layers appear matte and that the extra adhesive layer protects the image. U.S. Pat. Nos. 4,294,909 and 4,376,159, also suggest various methods for making a matte surface.

The support must have a release surface, that is, it must be capable of releasably holding the photosensitive layer thereto. This may be accomplished either by the substrate surface being inherently releasable, being rendered releasable by a suitable treatment or being provided with a release layer over the substrate surface. Such a release layer may comprise polyvinyl alcohol.

Reasonably bonded to the release surface is the photosensitive layer. The photosensitive layer broadly comprises a photosensitizer, a binding resin, and other optional ingredients such as plasticizers, acid stabilizers, surfactants, antistatic compositions, uv absorbers and residual coating solvents. The photosensitizer is preferably a light sensitive, polymeric diazonium salt. The most preferred diazonium salt photosensitizer is the polycondensation product of 3-methoxy-4-diazo-diphenyl amine sulfate and 4,4'-bis-methoxy methyl-diphenyl ether, precipitated as mesitylene sulfonate as taught in U.S. Pat. No. 3,849,392. Other suitable photosensitizers are taught in U.S. Pat. No. 4,436,804. The diazo compounds of choice are preferably soluble in organic solvents. All of the foregoing patents are incorporated herein by reference.

Suitable binding resins include polyvinyl butyral and styrene maleic anhydride copolymer half esters and mixtures thereof. Such resins include Butvar B72, B76 and B90 and Scripset 540 and 550, which are all available from Monsanto. An important resin selection criterion is that it must be a good film former.

The colorants useful for the present invention include various classes of dyes and pigments. In the most preferred embodiment, pigments having an average particle size of about 1 micrometer or less are used. Preferred colorants for this invention are pigments rather than dyes. They are dispersed in a small amount of a vehicle such as polyvinyl butyral, styrene-maleic anhydride copolymer half ester or polymethyl methacrylate/methacrylic acid (85/15) and a solvent such as methyl ethyl ketone. The pigment particles are ground to a small enough particle size to duplicate the particle size and color of equivalent inks.

Optional plasticizers which may be incorporated into the photosensitive layer include those of the phthalate and phosphate types. Preferred plasticizers include dibutyl phthalate and dimethyl phthalate. Acid stabilizers include phosphoric acid and p-toluene sulfonic acid.

In the preferred embodiment, the photosensitizer is present in the photosensitive layer in an amount of from about 5 to about 40 percent by weight or more preferably from about 10 to about 35 percent by weight.

In the preferred embodiment, the colorant is present in the photosensitive layer in an amount of from about 10 to about 40 percent by weight or more preferably from about 13 to about 34 percent by weight.

In the preferred embodiment, the binding resin is present in the photosensitive layer in an amount of from about 25 to about 80 parts by weight or more preferably from about 32 to about 75 parts by weight.

In the preferred embodiment, the plasticizer, when one is used, is present in the photosensitive layer in an amount of up to about 20 parts by weight or more preferably up to about 15 parts by weight and most preferably from about 12 to about 15 parts by weight.

In the preferred embodiment, the acid stabilizer, when one is used, is present in the photosensitive layer in an amount of up to about 10 parts by weight.

These ingredients may be blended with such compatible solvents as ethanol, methyl cellosolve and methyl ethyl ketone, coated on the release surface, and dried. In the preferred embodiment, the photosensitive layer has a coating weight of from about 0.1 to about 5.0 g/m2. The most preferred weight is from about 0.5 to about 2.0 g/m.

The adhesive layer comprises a thermally activated adhesive which is preferably a plasticizer in admixture with at least one copolymer selected from the group consisting of copolymers of methyl methacrylate and ethyl acrylate and copolymers of acrylic acid and acrylic esters having an acid number of from about 80 to about 100, and mixtures thereof. The adhesive layer may optionally contain such other desired components as uv absorbers and anti-static compositions. Useful copolymers of methyl methacrylate and ethyl acrylate non-exclusively include Acryloid B-44 available from Rohm & Haas of Philadelphia, Pa. Useful copolymers of acrylic acid-acrylic ester having an acid number of from about 80 to about 100 non-exclusively include Carboset 527 available from B. F. Goodrich of Cleveland, Ohio. In a preferred embodiment, the adhesive layer comprises a mixture of at least of a methyl methacrylate and ethyl acrylate copolymer and a copolymer of acrylic acid and acrylic esters having an acid number of from about 80 to about 100 in a weight ratio of from about 1:2 to about 2:1 and preferably about 1:1. In the preferred embodiment, the adhesive layer comprises an acrylic acid-acrylic ester copolymer having the formula

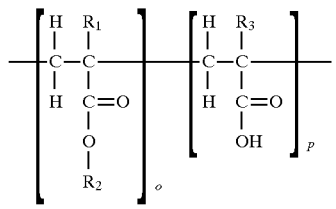

wherein:

$R_1$ is H or $CH_3$ $R_2$ is $CH_3$, $CH_2CH_3$, $(CH_2)_3CH_3$, n-octyl or 2-ethylhexyl $R_3$ is H, CH3 or COOH o is 4 to 12, and p is 1, and the copolymer has an average molecular weight in the range of from about 10,000 to about 300,000.

The preferred polymer has a Tg in the range of from about 45° C. to about 65° C.

The plasticizer component may be any plasticizer compound which is compatible with the polymer in the adhesive layer. Preferred plasticizers non-exclusively include liquid polyester plasticizers. The most preferred plasticizer is Resoflex R-296, available from Cambridge Industries. The overall adhesive layer should have a softening point in the range of from about 40° C. to about 120° C., preferably 40° C. to 100° C., more preferably 40° C. to 65° C. The layer may optionally contain a uv absorber such as Uvinul D-50 from G.A.F. It may also contain antistats, such as Gafac and Gafstat from G.A.F. It may also contain minor amounts of other resins which modify the rheological properties of the layer. These include Nitrocellulose RS 1/2, available from Hercules. The components may be dispersed in water or dissolved in a suitable solvent such as methyl isobutyl ketone or n-butyl acetate or other solvent compositions for coating on the photosensitive layer. It is then dried to a coating weight of from about 5 to about 30 g/m², more preferably from about 8.5 to about 9.5 g/m². The adhesive layer should not be tacky to the touch, during storage or during development of the photosensitive element.

In the preferred embodiment, the polymer or mixture of polymers is present in the adhesive layer in an amount of from about 90 to about 99, preferably from about 90 to about 96 percent by weight of the non-solvent parts of the composition.

The plasticizer may be present in an amount of from about 1 to about 30 percent, preferably from about 4 to about 10 weight percent based on the non-solvent parts of the composition. The uv absorber, antistat and other resins may be present in an amount of up to about 20 percent by weight.

A typical adhesive formulation is:

| n-butyl acetate | 79.90 |
| Resoflex R-296 | 1.00 |
| Acryloid B-44 | 10.00 |
| Carboset 527 | 10.00 |

In operation, the photosensitive element is laminated onto a receiver sheet via the adhesive layer. The receiver sheet should be resistant to any adverse influences which may be caused by the developer of choice. For example, the receiver sheet should be water resistant if aqueous developers are used. Plastic or plastic coated receiver sheets are useful for this purpose. Useful receiver sheets include Melinex 329, 339, 994 and 3020 from ICI. Other white and non-white receiver sheets may also be used. Rough textured and/or adhesion promoted surfaces are preferred for the receiver, which must be able to withstand the laminating and development processes.

Lamination may be conducted by contacting the receiver sheet with the adhesive side of the colored composite and then introducing the two materials into the nip of a pair of heated laminating rollers under suitable pressure. Suitable laminating temperatures usually range from about 60° C. to about 100° C., preferably about 75° C. to about 85° C. After lamination, the substrate is peeled away from the receiver sheet, usually by merely employing manual peeling forces. The adhesive and photosensitive layers thus remain on the receiver sheet.

The photosensitive layer is imagewise exposed to actinic radiation by means well known in the art either before or after lamination. Such exposure may be conducted by exposure to a uv light source through a photomask under vacuum frame conditions. Exposures after lamination and peel apart are preferred for emulsion-to-emulsion contact. Mercury vapor discharge lamps are preferred over metal halide lamps. Filters may be used to reduce light scattering in the material.

After lamination, peel apart and exposure, the photosensitive layer is developed by dissolving the non-exposed area in a suitable developer and dried. The adhesive layer is not removed by this development. Suitable developers non-exclusively include:

| I. | Water | 95.0 |
| | Sodium decyl sulphate | 3.0 |
| | Disodium phosphate | 1.5 |
| | Sodium metasilicate | 0.5 |
| II. | Water | 89.264 |
| | Monosodium phosphate | 0.269 |
| | Trisodiumphosphate | 2.230 |
| | Sodium tetradecyl sulfate | 8.237 |

Any developer solution which satisfactorily removes the non-image areas of the photosensitive layer after exposure while retaining the image areas may be used. The selection of developer is well within the ability of the skilled artisan.

The process can then be repeated whereby another photosensitive element having a different color is laminated to the same receiver sheet over the previously formed image. In the usual case, four colored layers are employed to produce a full color reproduction of a desired image. These are cyan, magenta, yellow and black.

The following non-limiting example serves to illustrate the invention.

EXAMPLE

Four photosensitive solutions of cyan, yellow, magenta, and black are produced by blending the photosensitive formulation components described below. The pigments are introduced as a dispersion of methyl ethyl ketone, Scripset 540, and the appropriate pigment. The solutions are coated and dried separately to the required optical density onto 3 mil Melinex 516 polyester films as a temporary support.

| Component | Yellow | Magenta | Cyan | Black |
|---|---|---|---|---|
| Methyl Cellosoive | 40 | 40 | 40 | 40 |
| Methyl Ethyl Ketone | 40 | 40 | 40 | 40 |
| Tetrahydrofuran | 10 | 10 | 10 | 10 |
| Butyrolactone | 5 | 5 | 5 | 4 |
| Carboset XL-27 | 1 | 0.75 | 0.75 | 1 |
| Elvacite 2014 | 0.5 | 0.25 | 0.25 | — |
| Carboset 525 | — | 0.25 | 0.25 | 1.5 |
| SMA 2625 | 0.5 | 0.75 | 0.75 | 0.5 |
| Diazo from U.S. Pat. No. 3,849,392 | 1.7 | 1.5 | 1.5 | 1.75 |
| Phthalo Blue Pigment | — | — | 1 | — |
| Yellow Pigment | 1.3 | — | — | — |
| Magenta Pigment | — | 1 | — | — |
| Black Pigment | — | — | — | 1.25 |
| Optical Density | 0.9 | 1.3 | 1.2 | 1.6 |

Scripset resins are from Monsanto. SMA resins are from Arco.

An adhesive film was made by blending the following in solution, coated on top of the photosensitive layers and dried to form a composite.

| | Parts by Weight |
|---|---|
| n-Butyl Acetate | 79.00 |
| Acryloid B-44 | 10.00 |
| Carboset 527 | 10.00 |
| Resoflex R-296 | 1.00 |

This adhesive film solution was coated over the photosensitive layer to a dry coating weight of from 8.5 to 9.5 g/m². The yellow composite is then laminated at 80° C. with the adhesive side onto a 7 mil Melinex 3020 polyester receiver sheet. The Melinex 516 temporary support is peeled away after lamination, leaving the adhesive and photosensitive layers on the receiver sheet. The yellow photosensitive layer is then exposed to actinic light through a photographic flat for the yellow color. The receiver sheet with the exposed yellow layer is then immersed for 15 seconds in developer II above at 27° C. with gentle pad rubbing on the photosensitive side. The non-exposed, yellow areas are washed off and the exposed areas remain after development. The adhesive layer is not affected by the developer. After this treatment, the imaged material is rinsed and then dried. The magenta composite is then laminated as before onto the imaged, yellow side of the receptor sheet. The temporary support is removed as before. The magenta layer is then exposed through the magenta flat. It is then processed as with the yellow. The magenta is followed in a like manner by cyan and then by black to give a four color image which is an accurate representation of the original from which separations are prepared.

What is claimed is:

1. A photographic element which comprises, in order:
   i) a substrate having a release surface; and
   ii) a single photosensitive layer directly on said release surface, which photosensitive layer comprises in admixture, a light sensitive, negative working, polymeric diazonium compound in an amount sufficient to photosensitive the layer; a resinous binder composition in an amount sufficient to bind the layer components, which resinous binder composition contains a major amount of at least one resin selected from the group consisting of a polyvinyl butyral polymer and a styrene-maleic anhydride copolymer half ester; and at least one colorant in an amount sufficient to color the layer; and
   iii) an adhesive layer directly adhered on said photosensitive layer, which adhesive layer comprises in admixture at least one copolymer selected from the group consisting of copolymers of methyl methacrylate and ethyl acrylate and copolymers of acrylic acid and acrylic esters having an acid number of from about 80 to about 100, said polymer having a Tg in the range of from about 45° C. to about 65° C.; and a sufficient amount of at least one compatible plasticizer such that the adhesive layer has a softening point in the range of from about 40° C. to about 120° C.

2. The element of claim 1 wherein the adhesive layer comprises a mixture of at least one copolymer selected from the group consisting of copolymers of methyl methacrylate and ethyl acrylate and copolymers of acrylic acid and acrylic esters having an acid number of from about 80 to about 100.

3. The element of claim 1 wherein the adhesive layer comprises an acrylic acid-acrylic ester copolymer having the formula

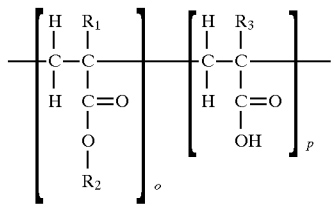

wherein:
   $R_1$ is H or $CH_3$
   $R_2$ is $CH_3$, $CH_2CH_3$, $(CH_2)_3CH_3$, n-octyl or 2-ethylhexyl
   $R_3$ is H, CH3 or COOH
   o is equal to 4 to 12, and
   p is equal to 1, and
   said copolymer having an average molecular weight in the range of from about 10,000 to about 300,000.

4. The element of claim 1 wherein said substrate comprises polyethylene terephthalate.

5. The element of claim 1 wherein said release surface on said substrate comprises polyvinyl alcohol.

6. The element of claim 1 wherein said photosensitive layer comprises the polycondensation product of 3-methoxy-4-diazo-diphenyl amine sulfate and 4,4'-bis-methoxy methyl-diphenyl ether precipitated mesitylene sulfonate.

7. The element of claim 1 wherein the adhesive layer has a coating weight of from about 8.5 to about 9.5 g/m².

8. The element of claim 1 wherein the adhesive layer further comprises one or more ingredients selected from the group consisting of uv absorbers, anti-static compositions, resins, and nitrocellulose.

9. The element of claim 1 wherein the copolymer is present in the dried adhesive layer in an amount of at least about 90 percent by weight.

10. The element of claim 1 wherein the plasticizer in the adhesive layer is a liquid polyester compound.

11. The element of claim 1 wherein the adhesive layer comprises a mixture of a copolymers of methyl methacrylate and ethyl acrylate and a copolymer of acrylic acid and acrylic esters having an acid number of from about 80 to about 100 wherein the copolymer mixture is present in the dried adhesive layer in an amount of at least about 90 percent by weight; the plasticizer in the adhesive layer is a liquid polyester compound; the adhesive layer has a coating weight of from about 8.5 to about 9.5 g/m$^2$; the substrate comprises polyethylene terephthalate; the release surface on said substrate comprises polyvinyl alcohol; the photosensitive layer comprises the polycondensation product of 3-methoxy-4-diazo-diphenyl amine sulfate and 4,4'-bis-methoxy methyl-diphenyl ether precipitated mesitylene sulfonate and the colorant is carbon black.

12. A method for forming a colored image which comprises:

A) providing a photographic element which comprises, in order:
 i) a substrate having a release surface; and
 ii) a single photosensitive layer directly on said release surface, which photosensitive layer comprises in admixture, a light sensitive, negative working, polymeric diazonium compound in an amount sufficient to photosensitize the layer; a resinous binder composition in an amount sufficient to bind the layer components, which resinous binder composition contains a major amount of at least one resin selected from the group consisting of a polyvinyl butyral polymer and a styrene-maleic anhydride copolymer half ester; and at least one colorant in an amount sufficient to color the layer; and
 iii) an adhesive layer directly adhered on said photosensitive layer, which adhesive layer comprises in admixture at least one copolymer selected from the group consisting of copolymers of methyl methacrylate and ethyl acrylate and copolymers of acrylic acid and acrylic esters having an acid number of from about 80 to about 100, said copolymer having a Tg in the range of from about 45° C. to about 65° C.; and a sufficient amount of at least one compatible plasticizer such that the adhesive layer has a softening point in the range of from about 40° C. to about 120° C.; and B) either
 i) laminating said element with heat and pressure via said adhesive layer to a developer resistant receiver sheet; and removing said substrate by the application of peeling forces; and imagewise exposing said photosensitive layer to actinic radiation; or
 ii) imagewise exposing said photosensitive layer to actinic radiation; and laminating said element with heat and pressure via said adhesive layer to a developer resistant receiver sheet; and removing said substrate by the application of peeling forces; or
 iii) laminating said element with heat and pressure via said adhesive layer to a developer resistant receiver sheet; and imagewise exposing said photosensitive layer to actinic radiation; and removing said substrate by the application of peeling forces; and C) removing the non-exposed areas of said photosensitive layer with a liquid developer, which removing is conducted at a temperature at which said adhesive layer is substantially non-tacky.

13. The method of claim 12 wherein the adhesive layer comprises a mixture of at least one copolymer selected from the group consisting of copolymers of methyl methacrylate and ethyl acrylate and copolymers of acrylic acid and acrylic esters having an acid number of from about 80 to about 100.

14. The method of claim 12 wherein the adhesive layer comprises an acrylic acid-acrylic ester copolymer having the formula

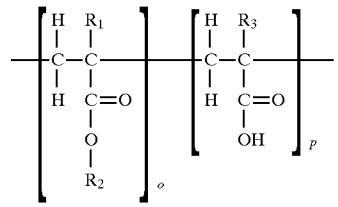

wherein:

$R_1$ is H or $CH_3$ $R_2$ is $CH_3$, $CH_2CH_3$, $(CH_2)_3CH_3$, n-octyl or 2-ethylhexyl $R_3$ is H, CH3 or COOH o is equal to 4 to 12, and p is equal to 1, and said copolymer having an average molecular weight in the range of from about 10,000 to about 300,000.

15. The method of claim 12 wherein steps A through C are repeated at least once whereby another photosensitive element having at least one different colorant is laminated onto said receiver sheet over the non-removed portions of the previously laminated photosensitive layer or layers.

16. The method of claim 12 wherein said substrate comprises polyethylene terephthalate.

17. The method of claim 12 wherein said release surface on said substrate comprises polyvinyl alcohol.

18. The method of claim 12 wherein said photosensitive layer comprises the polycondensation product of 3-methoxy-4-diazo-diphenyl amine sulfate and 4,4'-bis-methoxy methyl-diphenyl ether precipitated mesitylene sulfonate.

19. The method of claim 12 wherein the adhesive layer has a coating weight of from about 8.5 to about 9.5 g/m$^2$.

20. The method of claim 12 wherein the adhesive layer further comprises one or more ingredients selected from the group consisting of uv absorbers, anti-static compositions, resins, and nitrocellulose.

21. The method of claim 12 wherein the copolymer is present in the dried adhesive layer in an amount of at least about 90 percent by weight.

22. The method of claim 12 wherein the plasticizer in the adhesive layer is a liquid polyester compound.

23. The method of claim 12 wherein the lamination is conducted at a temperature of from about 60° C. to about 100° C.

24. The method of claim 12 wherein the adhesive layer comprises a mixture of at least one copolymer selected from the group consisting of copolymers of methyl methacrylate and ethyl acrylate and copolymers of acrylic acid and acrylic esters having an acid number of from about 80 to about 100; wherein the copolymer mixture is present in the dried adhesive layer in an amount of at least about 90 percent by weight; the plasticizer in the adhesive layer is a liquid polyester compound; the adhesive layer has a coating weight of from about 8.5 to about 9.5 g/m$^2$; the substrate comprises polyethylene terephthalate; the release surface on said substrate comprises polyvinyl alcohol; the photosensitive layer comprises the polycondensation product of 3-methoxy-4-diazo-diphenyl amine sulfate and 4,4'-bis-methoxy methyl-diphenyl ether precipitated mesitylene sulfonate and the colorant is carbon black.

* * * * *